US009054226B2

(12) United States Patent
Lee et al.

(10) Patent No.: US 9,054,226 B2
(45) Date of Patent: Jun. 9, 2015

(54) SEMICONDUCTOR DEVICES AND METHODS OF MANUFACTURING THE SAME

(75) Inventors: Sung-Ho Lee, Hwaseong-si (KR); Jin Choi, Yongin-si (KR); Yong-Ho Yoo, Yongin-si (KR); Jong-Hyuk Kang, Soul (KR); Hyun-Joo Cha, Seoul (KR); Hee-Dong Park, Yongin-si (KR); Tae-Jung Park, Busan (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 344 days.

(21) Appl. No.: 13/546,415

(22) Filed: Jul. 11, 2012

(65) Prior Publication Data
US 2013/0015559 A1 Jan. 17, 2013

(30) Foreign Application Priority Data

Jul. 13, 2011 (KR) .................. 10-2011-0069188

(51) Int. Cl.
*H01L 27/108* (2006.01)
*H01L 49/02* (2006.01)
(52) U.S. Cl.
CPC ........... *H01L 28/91* (2013.01); *H01L 27/10817* (2013.01); *H01L 27/10852* (2013.01)
(58) Field of Classification Search
CPC ............................................. H01L 27/10852
See application file for complete search history.

(56) References Cited

U.S. PATENT DOCUMENTS

2009/0068814 A1* 3/2009 Cho et al. ...................... 438/386
2010/0134950 A1* 6/2010 Choi et al. ................. 361/301.4

FOREIGN PATENT DOCUMENTS

KR   10-2009-0110692 A   10/2009
KR   10-2010-0061974 A   6/2010
KR   10-2010-0093925 A   8/2010

* cited by examiner

*Primary Examiner* — Ha Tran H Nguyen
*Assistant Examiner* — Aaron Dehne
(74) *Attorney, Agent, or Firm* — Lee & Morse, P.C.

(57) ABSTRACT

A semiconductor device includes a plurality of lower electrodes on a substrate, with each of the lower electrodes extending in a height direction from the substrate and including sidewalls, the lower electrodes being spaced apart from each other in a first direction and in a second direction, a plurality of first supporting layer patterns contacting the sidewalls of the lower electrodes, the first supporting layer patterns extending in the first direction between ones of the lower electrodes adjacent in the second direction, a plurality of second supporting layer patterns contacting the sidewalls of the lower electrodes, the second supporting layer pattern extending in the second direction between ones of the lower electrodes adjacent in the first direction, the plurality of second supporting layer patterns being spaced apart from the plurality of first supporting layer patterns in the height direction.

10 Claims, 21 Drawing Sheets

SEMICONDUCTOR DEVICES AND METHODS OF MANUFACTURING THE SAME

CROSS-REFERENCE TO RELATED APPLICATIONS

This application claims priority under 35 USC §119 to Korean Patent Application No. 2011-0069188, filed on Jul. 13, 2011, in the Korean Intellectual Property Office (KIPO), the entire disclosure of which is incorporated by reference herein.

BACKGROUND

1. Field

Example embodiments relate to semiconductor devices and methods of manufacturing the same. More particularly, example embodiments relate to semiconductor devices including capacitors and methods of manufacturing the same.

2. Description of the Related Art

As the integration degree of semiconductor device increases and the design rule of semiconductor devices decreases, a capacitor in the semiconductor device may have a high aspect ratio. Thus, a lower electrode of the capacitor may lean or collapse.

SUMMARY

According to example embodiments, there is provided a semiconductor device, including a plurality of lower electrodes on a substrate, each of the lower electrodes extending in a height direction from the substrate and including sidewalls, and the lower electrodes being spaced apart from each other in a first direction and in a second direction, a plurality of first supporting layer patterns extending in the first direction between ones of the lower electrodes that are adjacent to each other in the second direction, the first supporting layer patterns contacting the sidewalls of the ones of the lower electrodes that are adjacent to each other in the second direction, a plurality of second supporting layer patterns extending in the second direction between ones of the lower electrodes that are adjacent to each other in the first direction, the second supporting layer pattern contacting the sidewalls of the ones of the lower electrodes that are adjacent to each other in the second direction, the plurality of second supporting layer patterns being spaced apart from the plurality of first supporting layer patterns in the height direction.

The semiconductor device may further include a dielectric layer on the lower electrodes, and an upper electrode on the dielectric layer.

Each of the lower electrodes may be supported by the two of the first supporting layer patterns and the two of the second supporting layer patterns.

Each lower electrode may include a first portion corresponding to a height from a top surface of the lower electrode to a top surface of the second supporting layer pattern, a second portion corresponding to a height from the top surface of the second supporting layer pattern to a top surface of the first supporting layer pattern, and a third portion corresponding to a height from the top surface of the first supporting layer pattern to a bottom surface of the lower electrode. The first, second and third portions may have different cross-sectional shapes from one another. The first portion may have a hollow cylindrical shape.

A width in the first direction of the second portion may equal a distance between the two second supporting layer patterns supporting the lower electrode.

The second portion of the lower electrode may include a first pair of second portion sidewalls opposing each other in the first direction and a second pair of second portion sidewalls opposing each other in the second direction, the first pair of second portion sidewalls being planar in a height direction, and the second pair of second portion sidewalls having a curved or rounded shape.

A width in the second direction of the third portion may equal a distance between the two first supporting layer patterns supporting the lower electrode.

The third portion may have a hollow rectangular parallelepiped shape.

The first and second supporting layer patterns may include at least one of silicon nitride, silicon carbide, silicon oxynitride, and silicon carbonitride.

According to example embodiments, there is provided a method of manufacturing a semiconductor device, including forming a first mold layer on a substrate, the substrate including conductive regions, forming a plurality of first supporting layer patterns on the first mold layer, the first supporting layer patterns extending in a first direction and being spaced apart from each other by a first width, forming a second mold layer covering the first supporting layer patterns on the first mold layer, forming a plurality of second supporting layer patterns on the second mold layer, the second supporting layer patterns extending in a second direction perpendicular to the first direction and being spaced apart from each other by a second width, forming a third mold layer covering the second supporting layer patterns on the second mold layer, partially etching the third mold layer, the second mold layer and the first mold layer to form a plurality of openings, the openings exposing the conductive region, and forming lower electrodes on inner walls of the openings, the lower electrodes being in contact with the conductive region.

The method may further include forming a dielectric layer on the lower electrodes, and forming an upper electrode on the dielectric layer.

The first mold layer, the second mold layer and the third mold layer may be formed using at least one selected from propylene oxide (POX), undoped silicate glass (USG), spin on glass (SOG), phosphosilicate glass (PSG), borophosphosilicate glass (BPSG), flowable oxide (FOX), Tonen Silazane (TOSZ), tetraethyl orthosilicate (TEOS), plasma enhanced-TEOS (PE-TEOS) and high density plasma-chemical vapor deposition (HDP-CVD) oxide.

The first supporting layer patterns and the second supporting layer patterns may be formed using at least one selected from silicon nitride, silicon carbide, silicon oxynitride and silicon carbonitride.

The forming of the plurality of the openings includes performing an etching process in which the first and second supporting layer patterns are used as an etching mask.

The method may further include removing the first mold layer, the second mold layer and the third mold layer by a wet etching process after forming the lower electrodes. The wet etching process may be performed by using a hydrofluoric acid solution or a buffer oxide etchant solution.

According to example embodiments, there is provided a method of manufacturing a semiconductor device, including forming a first mold layer on a substrate, the substrate including conductive regions, forming a plurality of first supporting layer patterns on the first mold layer, the first supporting layer patterns extending in a first direction and being spaced apart from each other by a first width, forming a second mold layer covering the first supporting layer patterns on the first mold layer, forming a plurality of second supporting layer patterns on the second mold layer, the second supporting layer patterns extending in a second direction perpendicular to the first direction and being spaced apart from each other by a second width, forming a third mold layer covering the second supporting layer patterns on the second mold layer, forming mask patterns on the third mold layer, the mask patterns extending in the first direction, being spaced apart from each other by the first width and substantially overlapping the first supporting layer patterns, partially etching the third mold layer, the second mold layer and the first mold layer using the mask patterns and the first and second supporting layer patterns as etching masks to form a plurality of openings, the openings exposing the conductive region to form a plurality of openings, the openings exposing the conductive region, forming lower electrodes on inner walls of the openings, the lower electrodes being in contact with the conductive region.

The method may further include forming a dielectric layer on the lower electrodes, and forming an upper electrode on the dielectric layer.

A width in the first direction of the lower electrodes may be about equal to the second width by which second supporting layer patterns are spaced apart from each other in the second mold layer. A width in the second direction of the lower electrodes may be about equal to the first width by which first supporting layer patterns are spaced apart from each other in the first mold layer.

BRIEF DESCRIPTION OF THE DRAWINGS

Features will become apparent to those of ordinary skill in the art by describing in detail exemplary embodiments with reference to the attached drawings, in which.

Figure 1:
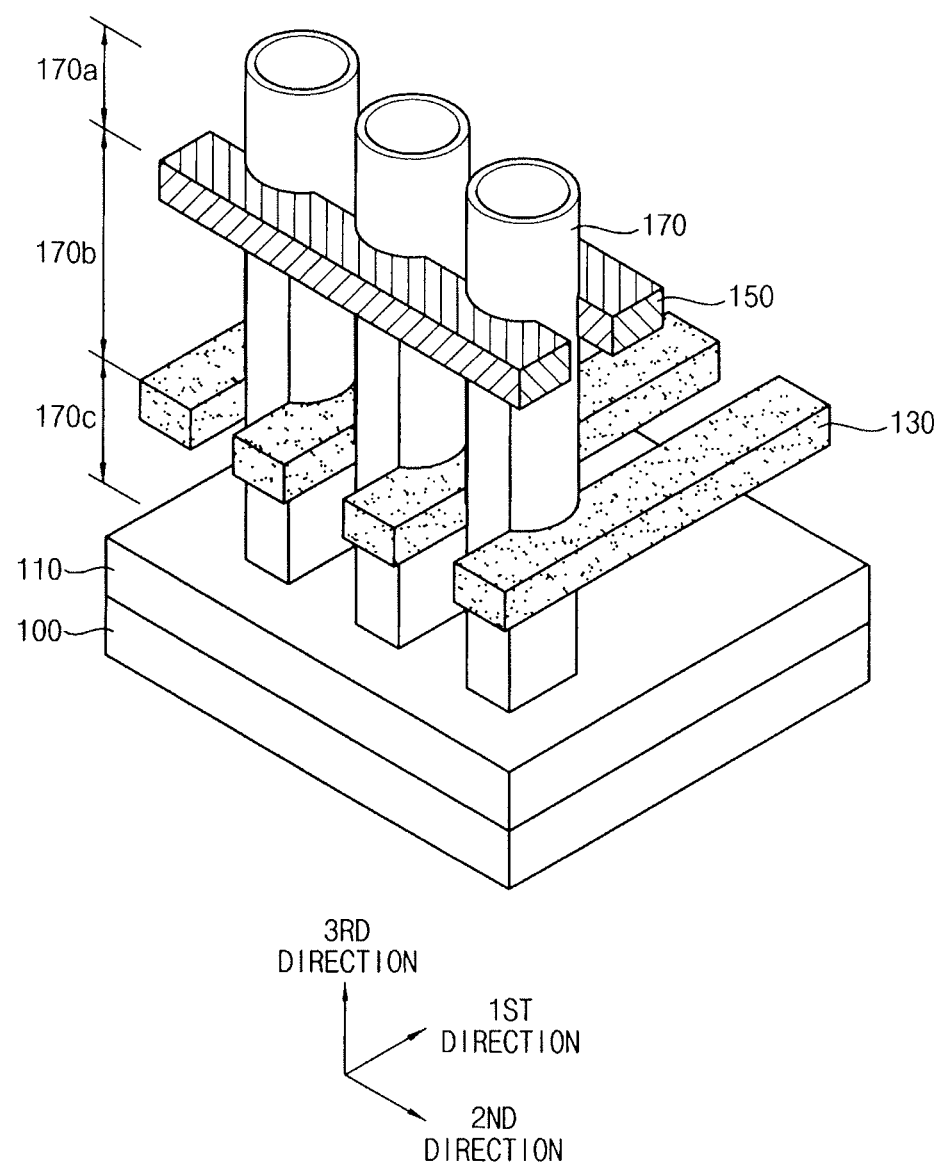
FIGS. 1 and 2 illustrate a perspective view and a top plan view, respectively, of a semiconductor device in accordance with example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope thereof to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. As used herein, the term "lower electrode" and "upper electrode" may be understood according to common usage in the art as referring to an arrangement of elements in a capacitor and do not necessarily imply any specific spatial orientation.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
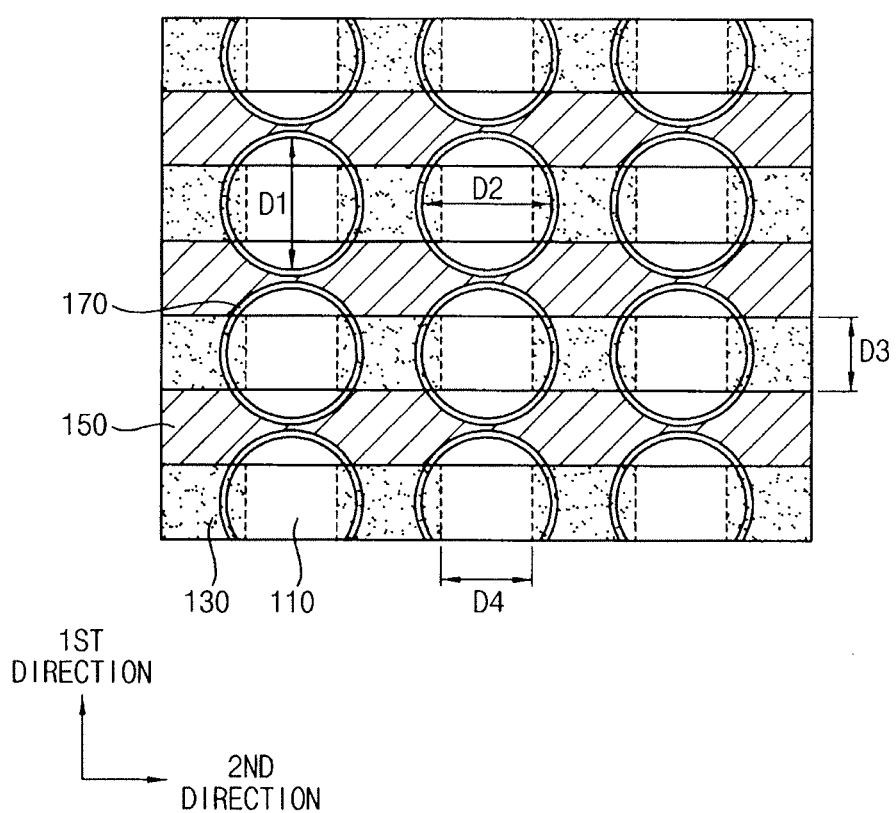

FIGS. 1 and 2 illustrate a perspective view and a top plan view, respectively, of a semiconductor device in accordance with example embodiments Referring to FIGS. 1 and 2, the semiconductor device may include a lower electrode 170, a first supporting layer pattern 130 and a second supporting layer pattern 150 formed on a substrate 100. The semiconductor device may further include a dielectric layer 180 (see FIGS. 15A and 15B) and an upper electrode 190 (see FIGS. 15A and 15B) sequentially formed on the lower electrode 170. The lower electrode 170, the dielectric layer and the upper electrode may define a capacitor.

The substrate 100 may include a semiconductor substrate such as a silicon (Si) substrate, a germanium (Ge) substrate, a silicon-germanium (Si—Ge) substrate, a silicon-on-insulator (SOI) substrate, a germanium-on-insulator (GOI) substrate, etc. Various lower structures (not illustrated) including, for example, a transistor, a bit line, an insulation pattern, etc., may be formed on the substrate 100.

An insulating interlayer 110 may be disposed between the substrate 100 and the lower electrode 170. In example embodiments, a plurality of plugs (not illustrated) may be formed through the insulating interlayer 110 and the plugs may be in contact with impurity regions (not illustrated) included in the substrate 100. In an example embodiment, an etch stop layer (not illustrated) may be further disposed on the insulating interlayer 110.

A bottom of the lower electrode 170 may be in contact with the plug. In example embodiments, a plurality of the lower electrodes 170 may be arranged in a first direction to form a lower electrode row, and a plurality of the lower electrode rows may be arranged regularly in a second direction substantially perpendicular to the first direction.

In example embodiments, the lower electrode 170 may include a metal or a metal nitride, for example, titanium, titanium nitride, tantalum, tantalum nitride, aluminum, aluminum nitride, titanium aluminum nitride, etc.

The first supporting layer pattern 130 may extend in the first direction and between the lower electrodes 170 adjacent in the second direction. In example embodiments, a plurality of the first supporting layer patterns 130 may be arranged in the second direction. The first supporting layer pattern 130 may contact opposite sidewalls of the adjacent lower electrodes 170 to support lower portions of the lower electrodes 170. Thus, the leaning or collapsing of the lower electrodes 170 may be prevented due to the first supporting layer pattern 130.

In example embodiments, the first supporting layer pattern 130 may include silicon nitride, silicon carbide, silicon oxynitride or silicon carbonitride.

The second supporting layer pattern 150 may be disposed over or above the first supporting layer pattern 130. The second supporting layer pattern 150 may extend in the second direction and between the lower electrodes 170 adjacent in the first direction. In example embodiments, a plurality of the second supporting layer patterns 150 may be arranged in the first direction. The second supporting layer pattern 150 may contact opposite sidewalls of the adjacent lower electrodes 170 to support upper portions of the lower electrodes 170. Further, the second supporting layer pattern 170 may prevent a bridge or a short-circuit from being generated between the adjacent lower electrodes 170.

In example embodiments, the second supporting layer pattern 150 may include silicon nitride, silicon carbide, silicon oxynitride or silicon carbonitride.

The lower electrode 170 may be divided into a first portion 170a, a second portion 170b and a third portion 170c by the first and second supporting layer patterns 130 and 150. In example embodiments, a height of the first portion 170a may correspond to a distance between a top surface of the lower electrode 170 and a top surface of the second supporting layer pattern 150. A height of the second portion 170b may correspond to a distance between the top surface of the second supporting layer pattern 150 and a top surface of the first supporting layer pattern 130. A height of the third portion 170c may correspond to a distance between the top surface of the first supporting layer pattern 130 and a bottom of the lower electrode 170.

As illustrated in FIGS. 1 and 2, the first portion 170a of the lower electrode 170 may have a substantially hollow cylindrical shape. The first portion 170a may have a width in the first direction (hereinafter, referred to as a first width D1) and a width in the second direction (hereinafter, referred to as a second width D2).

A width in the first direction of the second portion 170b may be limited by the adjacent second supporting layer patterns 150 that support the lower electrode 170 at opposite sidewalls in the first direction of the lower electrode 170. For example, the second portion 170b of the lower electrode 170 may have a third width D3 in the first direction, and the third width D3 may be less than the first width D1 of the first portion 170a.

In example embodiments, opposite sidewalls of the second portion 170b in the first direction may be substantially planar or even along a third direction that is substantially vertical to a top surface of the substrate 100. Opposite sidewalls of the second portion 170b in the second direction may have a shape that is substantially the same as or similar to that of the first portion 170a, for example, a substantially curved or rounded shape, A width in the second direction of the third portion 170c may be limited by the adjacent first supporting layer patterns 130 that support the lower electrode 170 at opposite sidewalls in the second direction of the lower electrode 170. For example, the third portion 170c of the lower electrode 170 may have a fourth width D4 in the second direction, and the fourth width D4 may be less than the second width D2 of the first portion 170a.

In example embodiments, opposite sidewalls of the third portion 170c in the first direction may be substantially planar or even along the third direction in a similar manner to that of the second portion 170*b*. Opposite sidewalls of the third portion 170*c* in the second direction may be also substantially planar or even along the third direction. Thus, the third portion 170*c* may have a substantially hollow rectangular parallelepiped shape that may have a cross-section of the third width D3×the fourth width D4.

In example embodiments, the upper part and the lower part of the lower electrode 170 may be supported by the second supporting layer pattern 150 and the first supporting layer pattern 130, respectively, that may extend substantially perpendicularly to each other. Specifically, each of the lower electrodes 170 may be supported by the two first supporting layer patterns 130 and the two second supporting layer patterns 150. Accordingly, even though the lower electrode 170 may have a high aspect ratio, leaning or collapsing of the lower electrode 170 may be prevented from all directions by the first and second supporting layer patterns 130 and 150.

Further, the width of the lower electrode 170 may be limited or controlled by the first and second supporting layer patterns 130 and 150. Therefore, a short-circuit or bridge phenomenon that may be generated when adjacent sidewalls of lower electrodes contact each other may be prevented.

Figure 3:
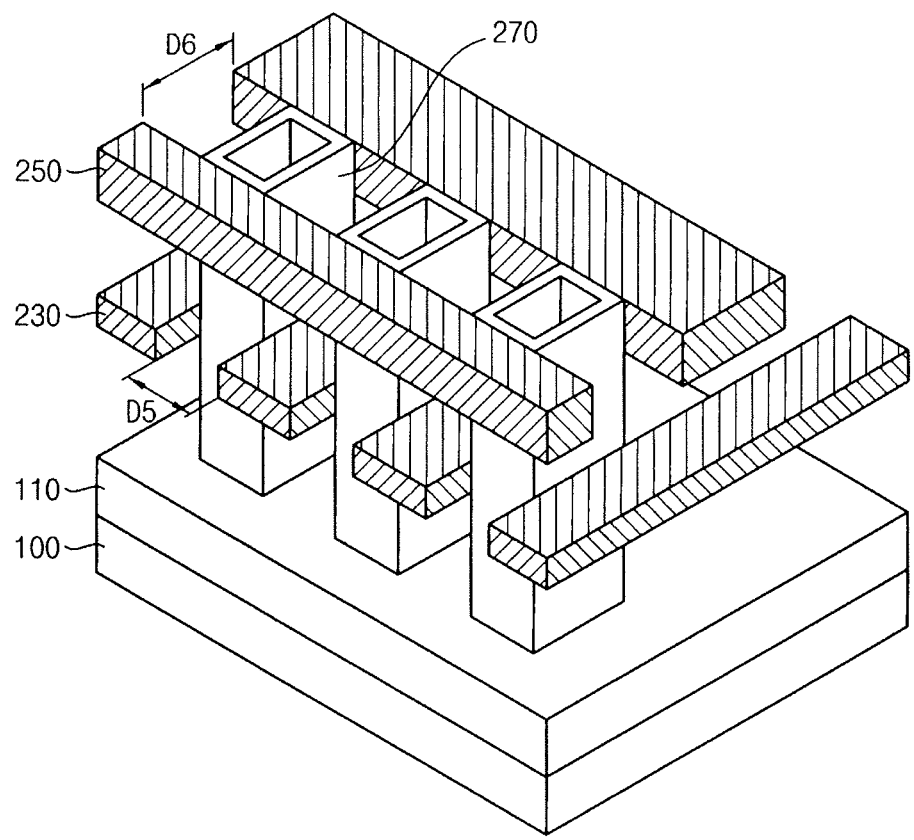
FIGS. 3 and 4 illustrate a perspective view and a top plan view, respectively, of a semiconductor device in accordance with some example embodiments.
Figure 3:
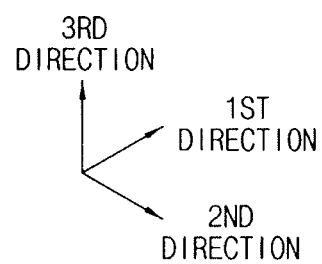
Figure 4:
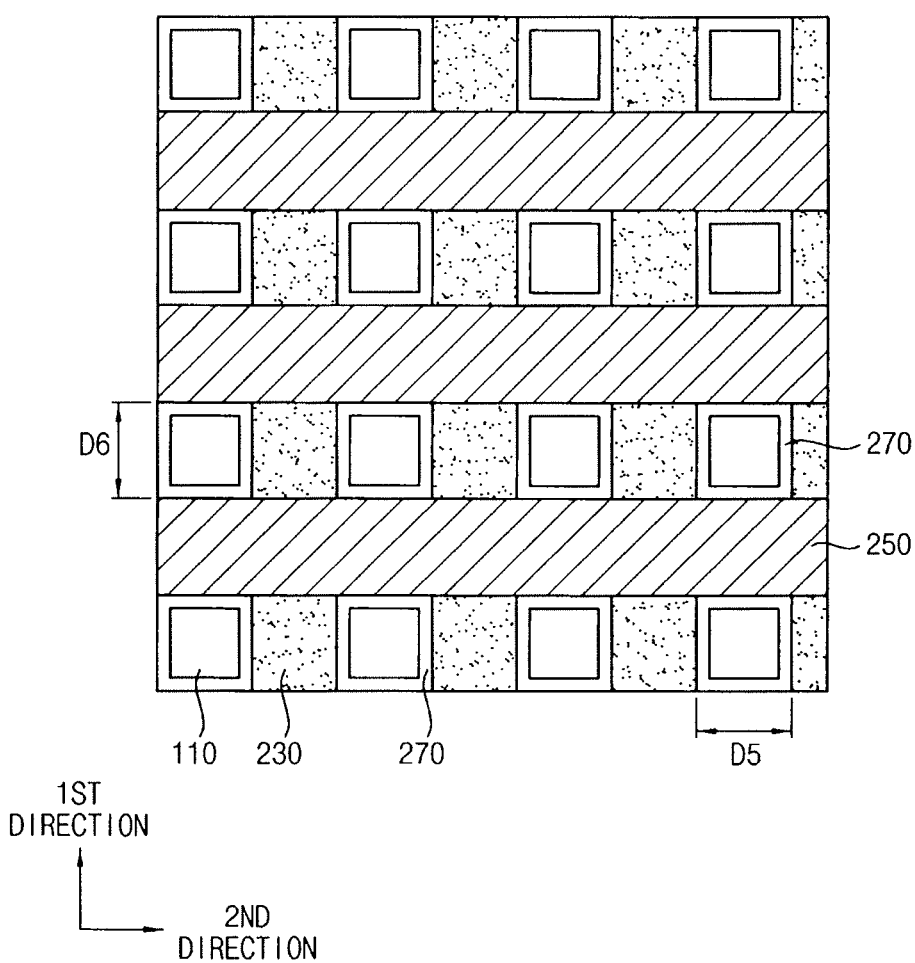

FIGS. 3 and 4 illustrate a perspective view and a top plan view, respectively, of a semiconductor device in accordance with some example embodiments.

Referring to FIGS. 3 and 4, the semiconductor device may include an insulating interlayer 110, a lower electrode 270, a first supporting layer pattern 230 and a second supporting layer pattern 250 formed on a substrate 100. The semiconductor device may further include a dielectric layer (not illustrated) and an upper electrode (not illustrated) sequentially formed on the lower electrode 270. The lower electrode 270, the dielectric layer and the upper electrode may define a capacitor.

The insulating interlayer 110 may be disposed between the substrate 100 and the lower electrode 270. In example embodiments, a plurality of plugs (not illustrated) may be formed through the insulating interlayer 110 and the plugs may be in contact with impurity regions (not illustrated) included in the substrate 100. In an example embodiment, an etch-stop layer (not illustrated) may be further disposed on the insulating interlayer 110.

A bottom of the lower electrode 270 may be in contact with the plug. In example embodiments, the lower electrode 270 may have a substantially hollow rectangular parallelepiped shape.

In example embodiments, a plurality of the lower electrodes 270 may be arranged in a first direction to form a lower electrode row, and a plurality of the lower electrode rows may be arranged regularly in a second direction substantially perpendicular to the first direction.

The first supporting layer pattern 230 may extend in the first direction and between the lower electrodes 270 adjacent in the second direction. In example embodiments, a plurality of the first supporting layer patterns 230 may be arranged in the second direction. The first supporting layer pattern 230 may contact opposite sidewalls of the adjacent lower electrodes 270 to support lower portions of the lower electrodes 270. The adjacent first supporting layer patterns 230 may be spaced apart from each other by a distance of a fifth width D5.

The second supporting layer pattern 250 may be disposed over the first supporting layer pattern 230 and may extend in the second direction and between the lower electrodes 270 adjacent in the first direction. In example embodiments, a plurality of the second supporting layer patterns 250 may be arranged in the first direction. The second supporting layer pattern 250 may contact opposite sidewalls of the adjacent lower electrodes 270 to support upper portions of the lower electrodes 270. The adjacent second supporting layer patterns 250 may be spaced apart from each other by a distance of a sixth width D6.

A width in the second direction of the lower electrode 270 may be defined by the first supporting layer patterns 230. For example, the width in the second direction of the lower electrode 270 may correspond to the fifth width D5.

A width in the first direction of the lower electrode 270 may be defined by the second supporting layer patterns 250. For example, the width in the first direction of the lower electrode 270 may correspond to the sixth width D6.

In example embodiments, the upper part and the lower part of the lower electrode 270 may be supported by the second supporting layer pattern 250 and the first supporting layer pattern 230, respectively, so that the lower electrode 270 may have enhanced structural stability.

Further, the width of the lower electrode 270 and a distance between the adjacent lower electrodes 270 may be limited or controlled by the first and second supporting layer patterns 230 and 250. Therefore, a short-circuit or bridge phenomenon that may be generated between adjacent lower electrodes may be prevented.

Figure 6:
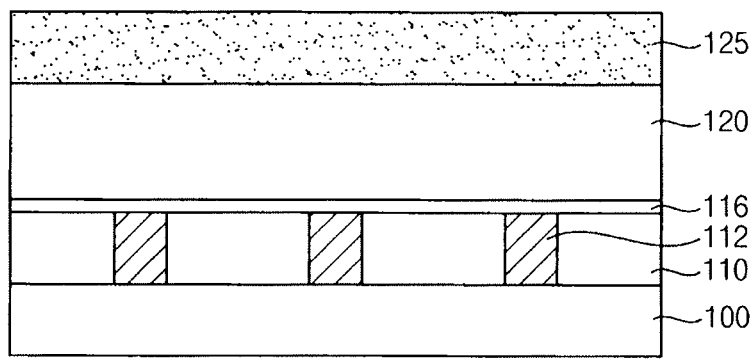
Figure 7:
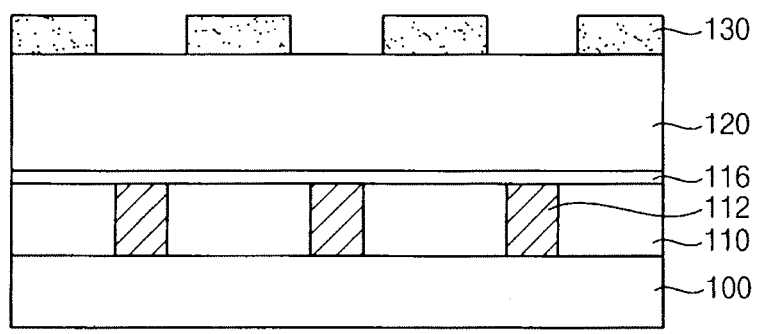
Figure 8:
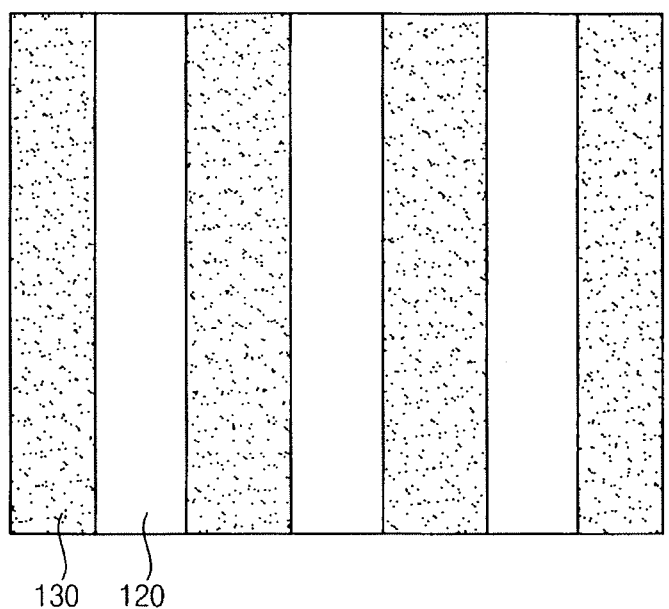
Figure 10A:
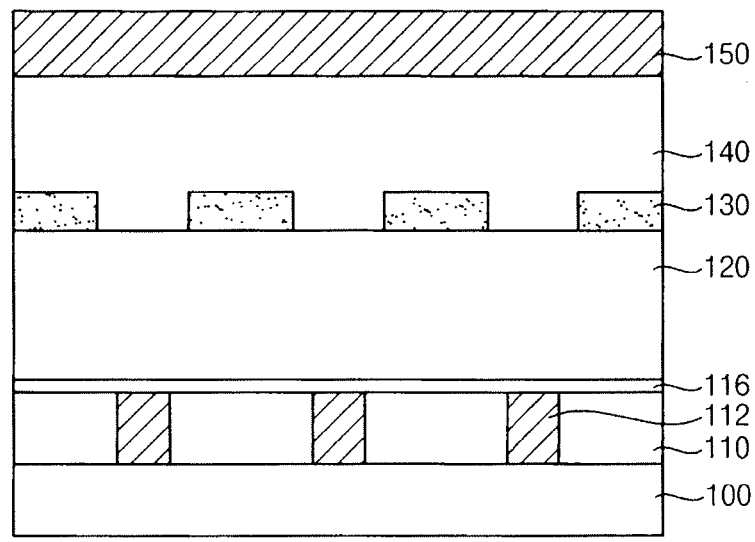
Figure 10B:
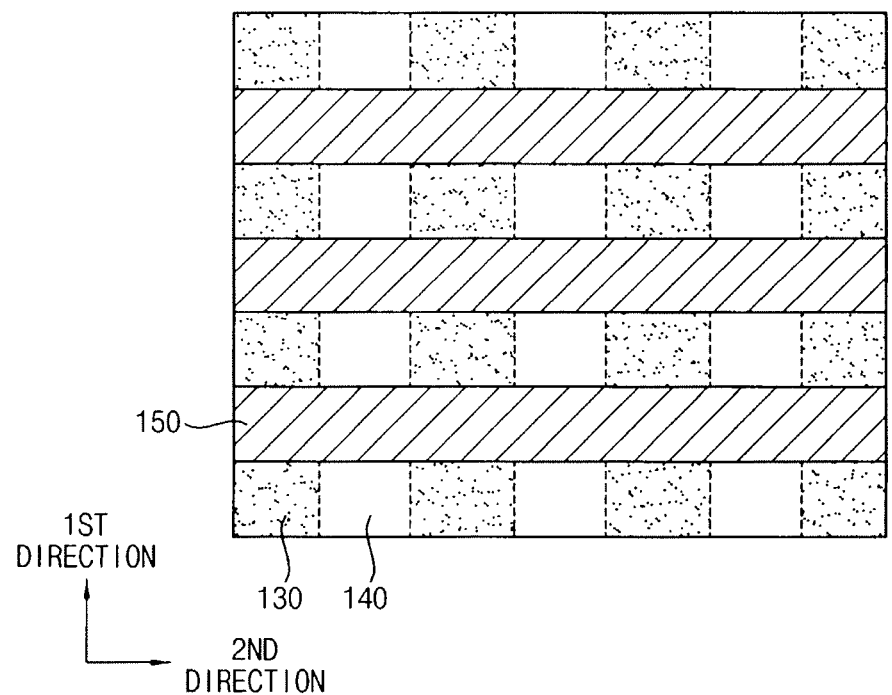
Figure 11:
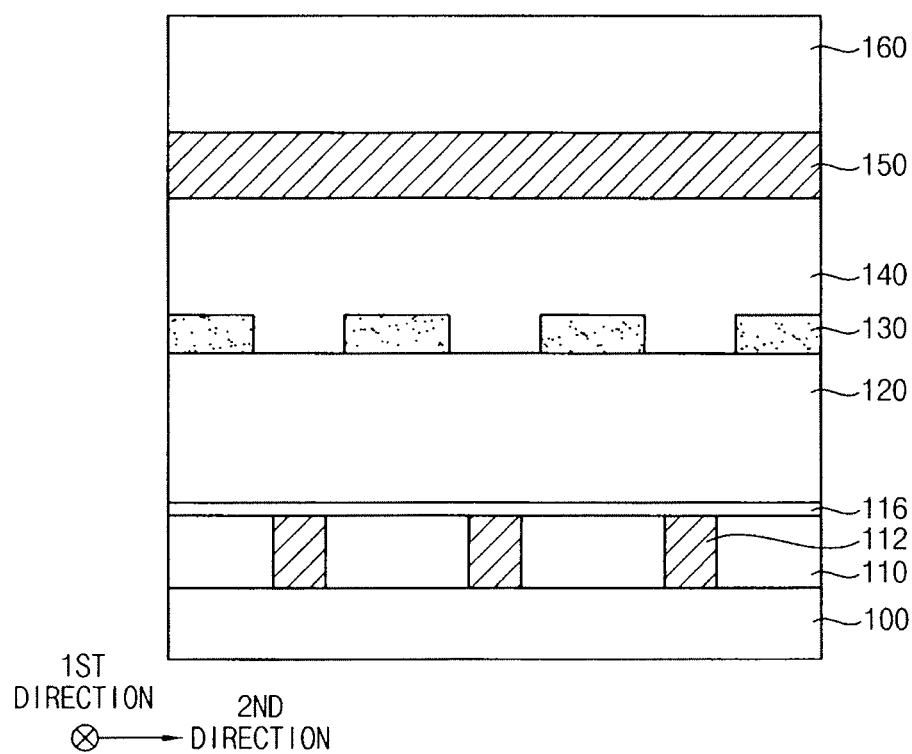
Figure 12:
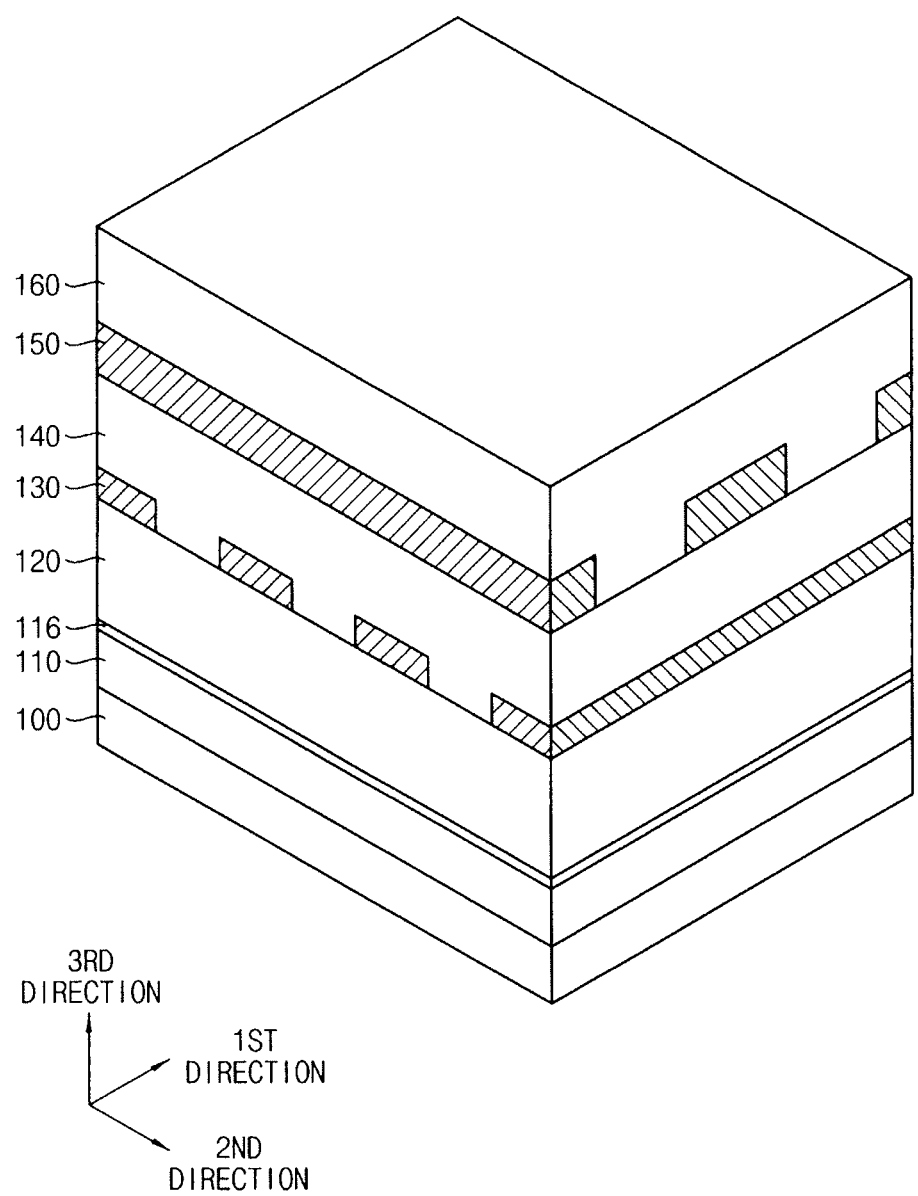

FIGS. 5 to 14C illustrate perspective, cross-sectional and top plan views of stages of a method of manufacturing a semiconductor device in accordance with example embodiments. Specifically, FIGS. 5 to 7, 9, 10A, 11, 13C, 13D, 14B, 14C, 15A and 15B illustrate cross-sectional views, FIGS. 8, 10B and 13B illustrate top plan views, and FIGS. 12, 13A and 14A illustrate perspective views illustrating stages in a method of manufacturing the semiconductor device.

Figure 5:
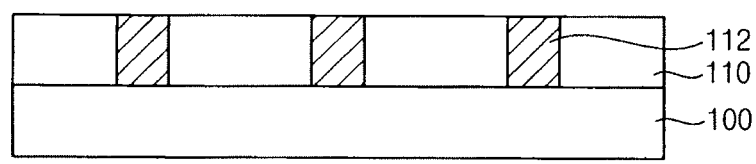
FIGS. 5, 6, 7, 8, 9, 10A, 10B, 11, 12, 13A, 13B, 13C, 13D, 14A, 14B, 14C, 15A and 15B illustrate perspective, cross-sectional and top plan views of stages of a method of manufacturing a semiconductor device in accordance with example embodiments.

Referring to FIG. 5, an insulating interlayer 110 may be formed on a substrate 100. A plurality of plugs 112 penetrating the insulating interlayer 110 may be formed on the substrate 100.

In example embodiments, the substrate 100 may include a semiconductor substrate such as a silicon (Si) substrate, a germanium (Ge) substrate, a silicon-germanium (Si—Ge) substrate, a silicon-on-insulator (SOI) substrate, a germanium-on-insulator (GOI) substrate, etc. Various lower structures (not illustrated) including, for example, a transistor, a bit line, an insulation pattern, etc., may be formed on the substrate 100.

The insulating interlayer 110 may be formed using silicon oxide by, e.g., a chemical vapor deposition (CVD) process, a plasma enhanced chemical vapor deposition (PECVD) process, a spin coating process, a high density plasma-chemical vapor deposition (HDP-CVD) process, a low pressure chemical vapor deposition (LPCVD) process, etc.

The insulating interlayer 110 may be partially removed by, e.g., a photolithography process to form a plurality of contact holes (not illustrated) partially exposing the substrate 100. In example embodiments, conductive regions such as impurity regions (not illustrated) may be formed at upper portions of the substrate 100, and the conductive regions may be exposed by the contact holes. A conductive layer may be formed on the substrate 100 and the insulating interlayer 110 to sufficiently fill the contact holes. A planarization process may be performed on the conductive layer until a top surface of the insulating interlayer 110 is exposed to form the plugs.

The conductive layer may be formed using a conductive material, for example, doped polysilicon, a metal or a metal nitride. The conductive layer may be obtained by a CVD process, a physical vapor deposition (PVD) process, an atomic layer deposition (ALD) process, etc. The planarization process may include a chemical mechanical polishing (CMP) process and/or an etch-back process.

Referring to FIG. 6, an etch-stop layer 116, a first mold layer 120 and a first supporting layer 125 may be sequentially formed on the insulating interlayer 110 and the plugs 112.

The etch-stop layer 116 may prevent the insulating interlayer 110 from being etched or damaged during subsequent etching processes so that lower structures formed on the substrate 100 may be protected. The etch-stop layer 116 may be formed using silicon nitride by, e.g., a CVD process, a PECVD process, an LPCVD process, etc.

The first mold layer 120 may be formed using, e.g., silicon oxide by a CVD process, a PECVD process, a spin coating process, an HDP-CVD process, etc. For example, the first mold layer 120 may be formed using propylene oxide (POX), undoped silicate glass (USG), spin on glass (SOG), phosphor silicate glass (PSG), boro-phosphor silicate glass (BPSG), flowable oxide (FOX), Tonen Silazane (TOSZ), tetra ethyl ortho silicate (TEOS), plasma enhanced-TEOS (PE-TEOS), high density plasma-chemical vapor deposition (HDP-CVD) oxide, etc. These may be used alone or in a combination thereof.

The first supporting layer 125 may be formed using silicon nitride, silicon carbide, silicon carbonitride or silicon oxynitride on the first mold layer 120. These may be used alone or in a mixture thereof. The first supporting layer 125 may be obtained by a CVD process, a PECVD process, an LPCVD process, etc.

Referring to FIGS. 7 and 8, the first supporting layer 125 may be partially etched to form a plurality of first supporting layer patterns 130 each of which may extend in a first direction on the first mold layer 120.

In example embodiments, a photoresist pattern (not illustrated) may be formed on the first supporting layer 125. The first supporting layer 125 may be patterned using the photoresist pattern as an etching mask to form the first supporting layer patterns 130.

The photoresist pattern may be removed by an ashing process and/or a strip process.

Figure 9:
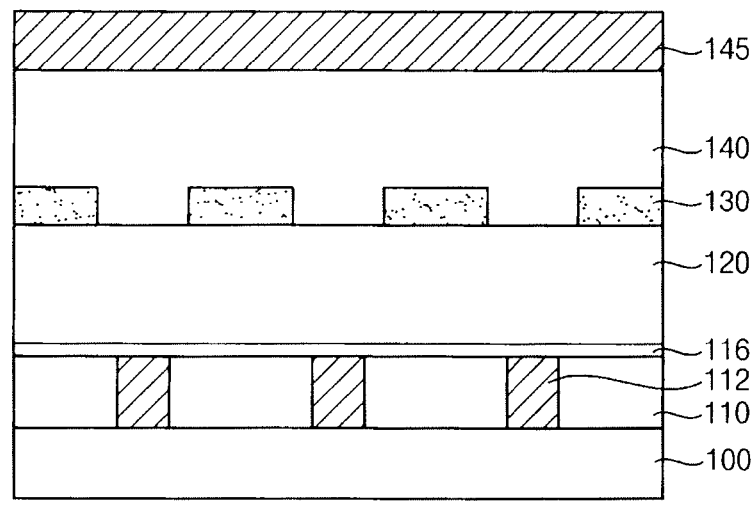

Referring to FIG. 9, a second mold layer 140 covering the first supporting layer patterns 130 may be formed on the first mold layer 120. A second supporting layer 145 may be formed on the second mold layer 140.

The second mold layer 140 may be formed using silicon oxide, e.g., POX, USG, SOG, PSG, BPSG, FOX, TOSZ, TEOS, PE-TEOS, HDP-CVD oxide, etc. These may be used alone or in a combination thereof. The second mold layer 140 may be obtained by a CVD process, a PECVD process, a spin coating process, an HDP-CVD process, etc.

The second supporting layer 145 may be formed using silicon nitride, silicon carbide, silicon carbonitride, or silicon oxynitride. These may be used alone or in a mixture thereof. The second supporting layer 145 may be obtained by a CVD process, a PECVD process, an LPCVD process, etc.

Referring to FIGS. 10A and 10B, the second supporting layer 145 may be partially etched to form a plurality of second supporting layer patterns 150 on the second mold layer 140. Each of the second supporting layer patterns 150 may extend in a second direction substantially perpendicular to the first direction. The first supporting layer patterns 130 formed under the second mold layer 140 are indicated by dashed lines.

In example embodiments, a photoresist pattern (not illustrated) may be formed on the second supporting layer 145. The second supporting layer 145 may be patterned using the photoresist pattern as an etching mask to form the second supporting patterns 150. The photoresist pattern may be removed by, e.g., an ashing process and/or a strip process.

The second supporting layer patterns 150 may be formed at a predetermined position to prevent a bowing phenomenon that may be generated when an opening 165 (see FIG. 13A) is formed. In example embodiments, the second supporting layer patterns 150 may be formed at the predetermined position by adjusting a height of the second mold layer 140.

Referring to FIGS. 11 and 12, a third mold layer 160 covering the second supporting layer patterns 150 may be formed on the second mold layer 140.

The third mold layer 160 may be formed using silicon oxide, e.g., POX, USG, SOG, PSG, BPSG, FOX, TOSZ, TEOS, PE-TEOS, HDP-CVD oxide, etc. These may be used alone or in a combination thereof. The third mold layer 160 may be obtained by a CVD process, a PECVD process, a spin coating process, an HDP-CVD process, etc.

Referring to FIGS. 13A to 13D, the third mold layer 160, the second mold layer 140 and the first mold layer 120 may be sequentially and partially etched, and then the etch-stop layer 116 may be partially removed to form a plurality of the openings 165 that may expose the plugs 112 formed through the insulating interlayer 110. Each of the openings 165 may have a first width D1 in the first direction and a second width D2 in the second direction in the third mold layer 160.

In example embodiments, the etching process for forming the opening 165 may be carried out under a condition having a relatively high etching selectivity for the first, second and third mold layers 120, 140 and 160 with respect to the first and second supporting layer patterns 130 and 150. Thus, the first and second supporting layer patterns 130 and 150 may not be substantially removed and may serve as an etching mask.

Figure 13A:
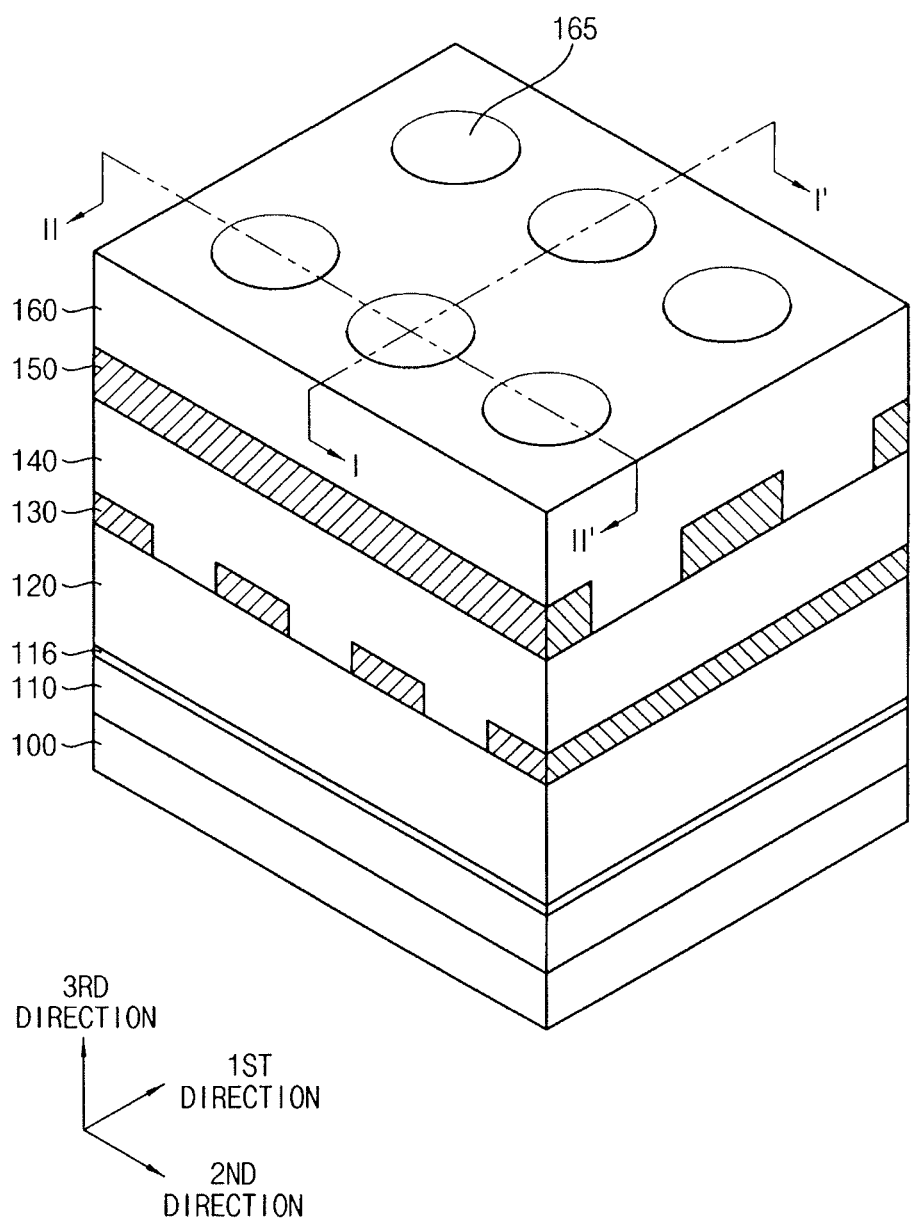
Figure 13B:
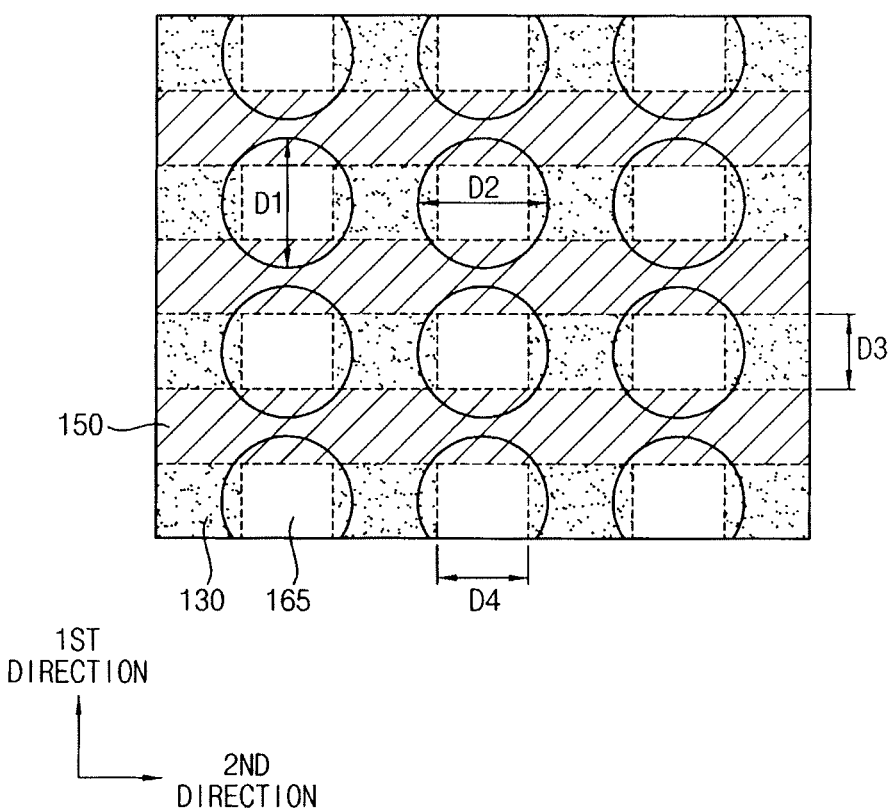
Figure 13C:
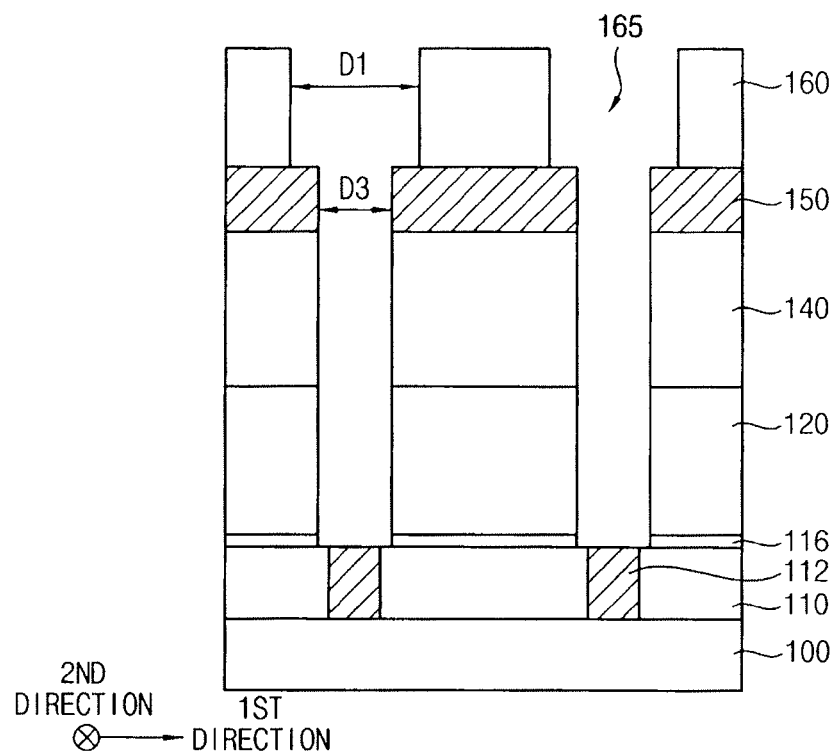

Referring to FIG. 13B and FIG. 13C, which is a cross-sectional view taken along a line I-I' of FIG. 13A, the opening 165 may have a third width D3 substantially smaller than the first width D1 in the second supporting layer patterns 150 and the second mold layer 140. As mentioned above, the second supporting layer patterns 150 may serve as the etching mask such that the third width D3 of the opening 165 may be defined by a distance between the second supporting layer patterns 150 adjacent in the first direction.

Figure 13D:
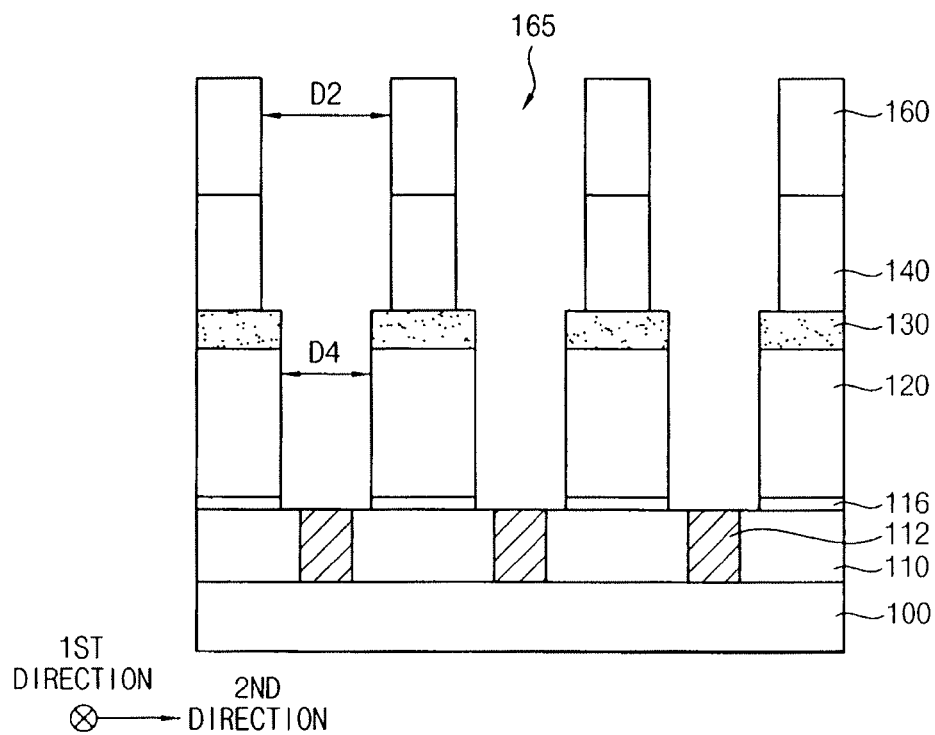

Referring to FIG. 13B and FIG. 13D, which is a cross-sectional view taken along a line II-II' of FIG. 13A, the opening 165 may have a fourth width D4 substantially smaller than the second width D2 in the first supporting layer patterns 130 and the first mold layer 120. As mentioned above, the first supporting layer patterns 130 may serve as the etching mask such that the fourth width D4 of the opening 165 may be defined by a distance between the first supporting layer patterns 130 adjacent in the second direction.

As described above, the width in the second direction and the width in the first direction of the opening 165 may be decreased by the first supporting layer patterns 130 and the second supporting layer patterns 150, respectively. Accordingly, a lower portion of the opening 165 may have a substantially hollow rectangular parallelepiped shape.

Figure 14A:
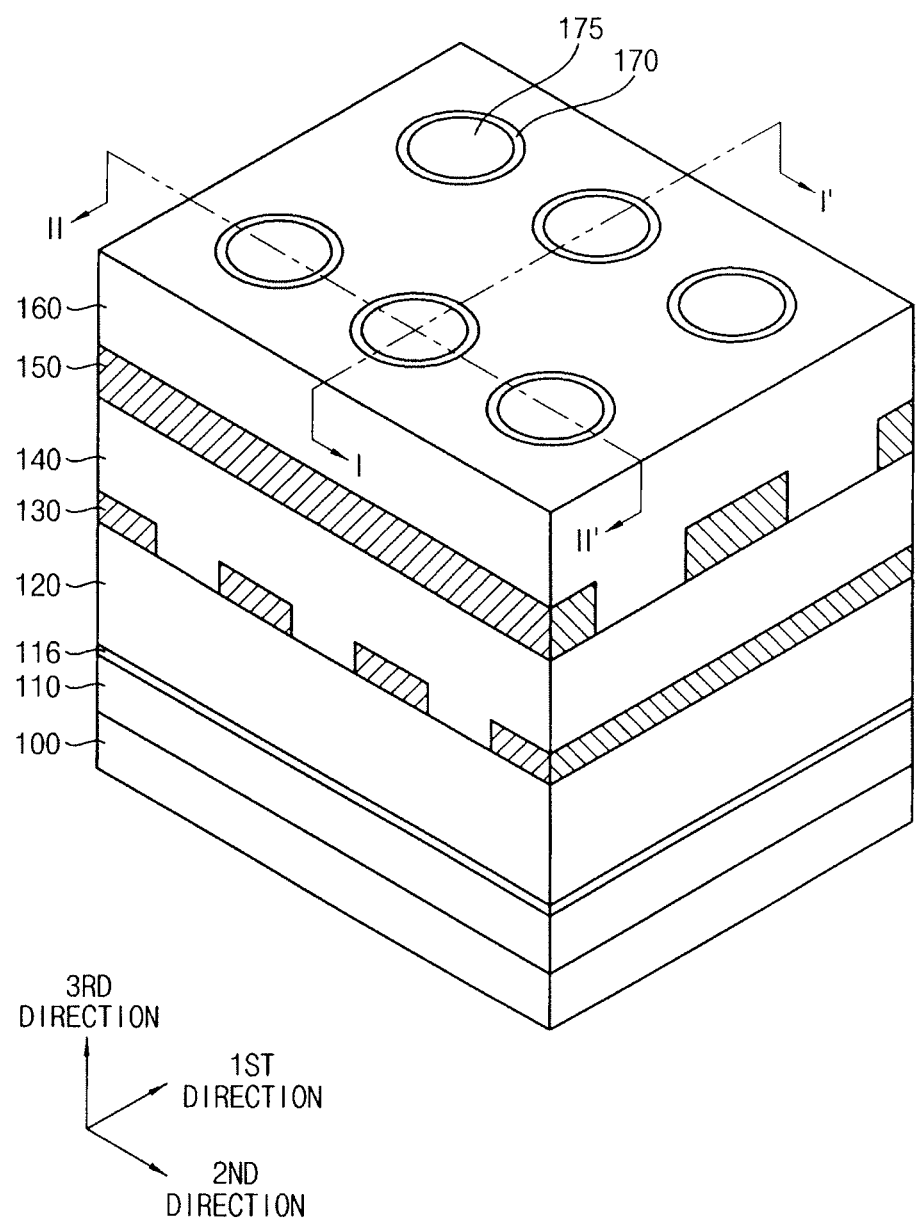
Figure 14B:
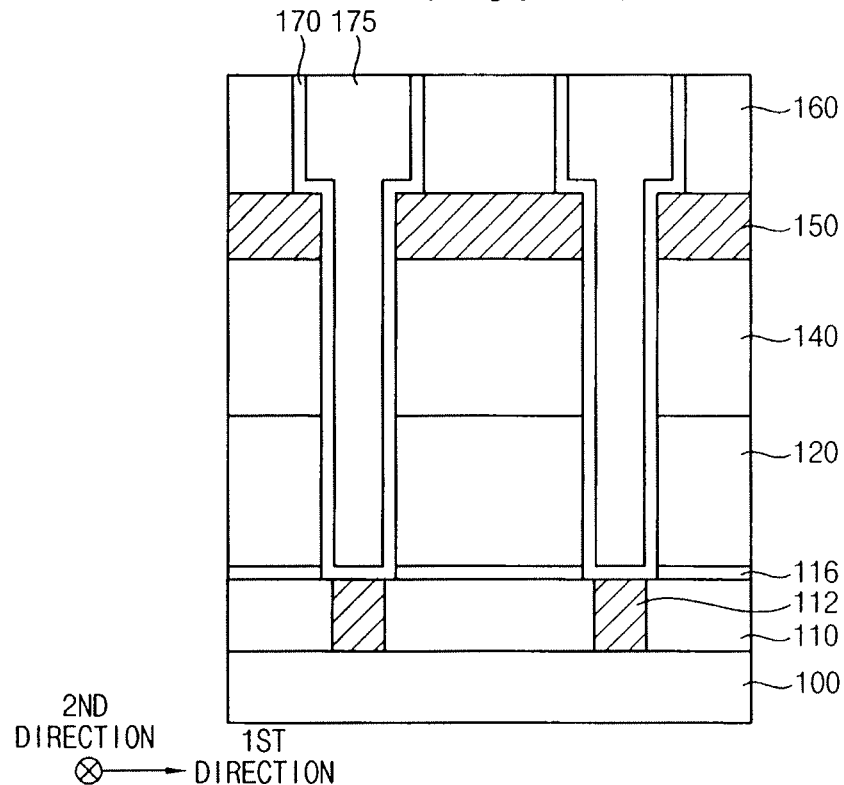
Figure 14C:
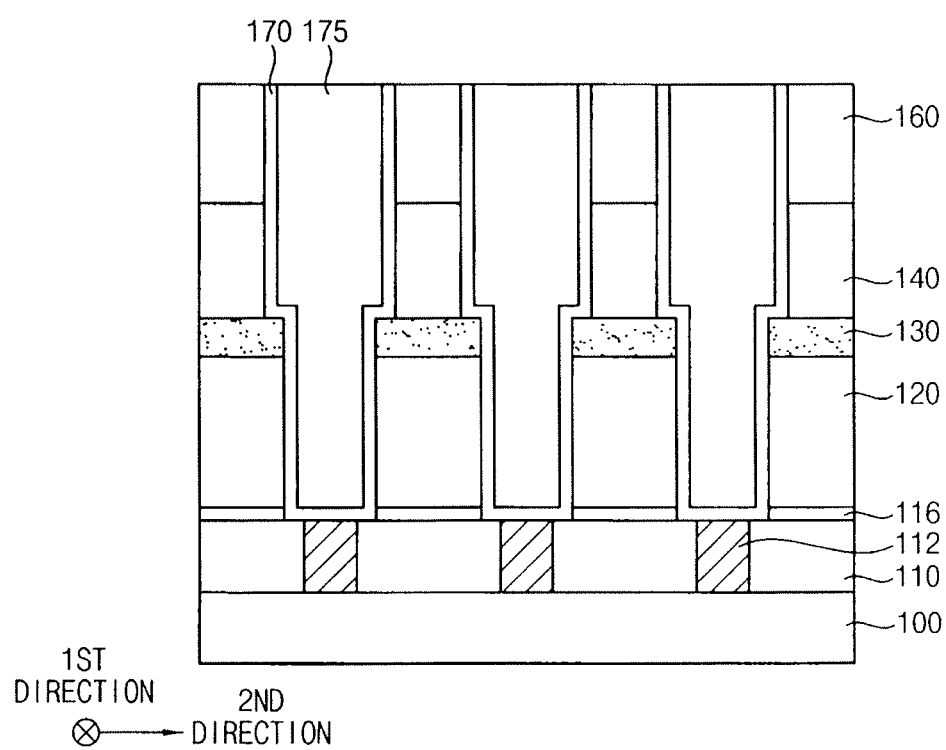

Referring to FIG. 14A together with FIGS. 14B and 14C, which are cross-sectional views taken along lines I-I' and II-II' of FIG. 14A, respectively, a lower electrode 170 may be formed on an inner wall of the opening 165 and on the exposed insulating interlayer 110 and the plug 112. A sacrificial layer pattern 175 filling a remaining portion of the opening 165 may be formed on the lower electrode 170.

In example embodiments, a lower electrode layer may be formed on the inner wall of the opening 165 and on the exposed insulating interlayer 110 and the plug 112. A sacrificial layer filling the remaining portion of the opening 165 may be formed on the lower electrode layer.

The lower electrode layer may be formed using a metal or a metal nitride including, e.g., titanium, titanium nitride, tantalum, tantalum nitride, aluminum, aluminum nitride, titanium-aluminum nitride, ruthenium, ruthenium nitride, etc. These may be used alone or in a mixture thereof. Alternatively, the lower electrode layer may be formed using doped polysilicon. The lower electrode layer may be obtained by a sputtering process, a CVD process, an ALD process, a PVD process, a vacuum evaporation process, etc. The sacrificial layer may be formed using POX, BPSG, PSG, USG, SOG, FOX, TOSZ, TEOS, PE-TEOS, HDP-CVD oxide, etc., by, e.g., a CVD process or a PECVD process.

Upper portions of the sacrificial layer and the lower electrode layer may be planarized until a top surface of the third mold layer 160 is exposed to form the lower electrode 170 and the sacrificial layer pattern 175. The planarization process may include a CMP process and/or an etch-back process.

Next, the sacrificial layer pattern 175, the first mold layer 120, the second mold layer 140 and the third mold layer 160 may be removed by a wet etching process to obtain the structure illustrated in FIG. 1. A hydrofluoric acid (HF) solution or a buffer oxide etchant (BOE) solution may be used as an etching solution in the wet etching process. The first and second supporting layer patterns 130 and 150 may have a very low etching rate with respect to the etching solution. Thus, the first and second supporting layer patterns 130 and 150 may not be substantially removed. Accordingly, an upper portion and a lower portion of the lower electrode 170 may be supported by the second supporting layer patterns 150 and the first supporting layer patterns 130, respectively. In example embodiments, the first and second supporting layer patterns 130 and 150 may support the lower electrode 170 in a substantially perpendicular direction to each other. Additionally, a size or a width of the lower electrode 170 may be controlled by the first and second supporting layer patterns 130 and 150 so that short-circuit or bridge phenomena between sidewalls of the adjacent lower electrodes 170 may be prevented.

Figure 15A:
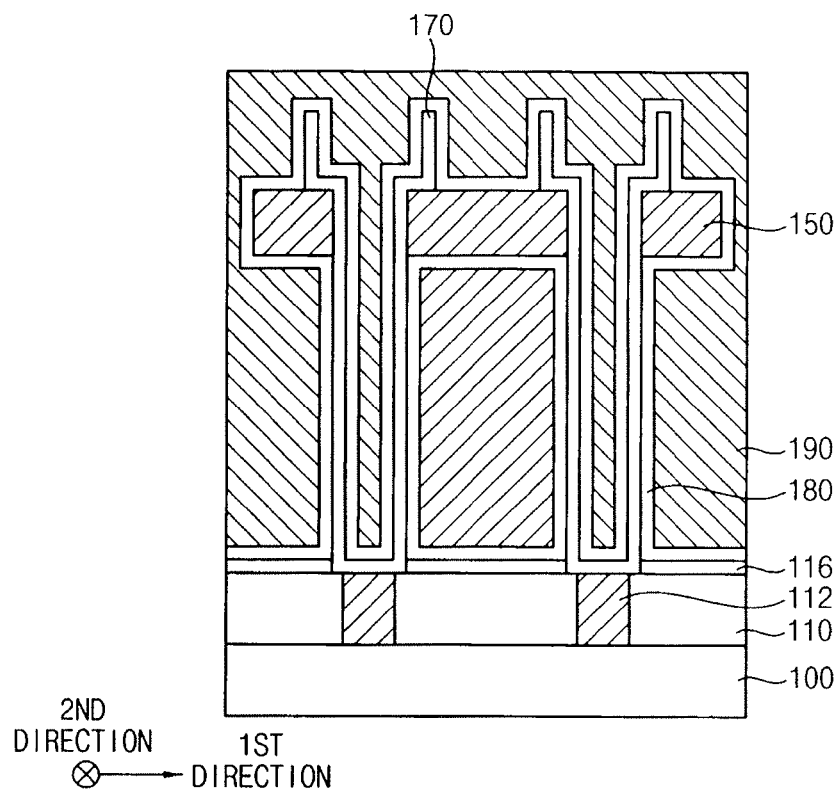
Figure 15B:
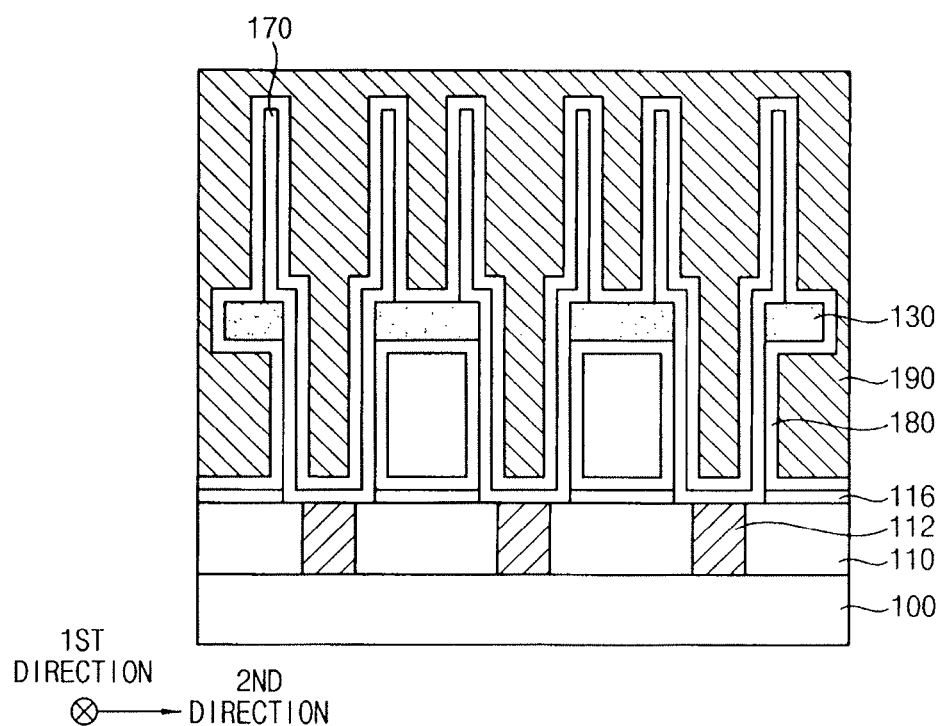

Referring to FIGS. 15A and 15B, a dielectric layer 180 may be formed on the lower electrodes 170, the first supporting layer patterns 130, the second supporting layer patterns 150 and the etch-stop layer 116, and an upper electrode 190 may be formed on the dielectric layer 180 to obtain capacitors.

The dielectric layer 180 may be formed using a material that has a high dielectric constant, for example, tantalum oxide, hafnium oxide, aluminum oxide, zirconium oxide, etc. These may be used alone or in a combination thereof.

The upper electrode 190 may be formed using a metal, a metal nitride or doped polysilicon by, e.g., a CVD process, a PVD process, an ALD process, etc.

According to example embodiments described above, the first supporting layer pattern 130 and the second supporting layer pattern 150 may be individually formed, and then the lower electrode 170 supported by the first and second layer patterns 130 and 150 may be formed. In a comparative method, a first supporting layer and a second supporting layer may be formed, and then an opening and a lower electrode may be formed. The second supporting layer and the first supporting layer may be sequentially etched to form a first supporting layer pattern and a second supporting layer pattern. In this case, when a distance between the first and second supporting layers is large, the second supporting layer may not be easily etched. However, in example embodiments, the first and second supporting layer patterns 130 and 150 may be formed by individual etching processes. Thus, the first and second supporting layer patterns 130 and 150 may be formed at predetermined positions regardless of the distance between the first and second supporting layers. Therefore, the positions of the first and second supporting layer patterns 130 and 150 may be adjusted considering positions at which bowing or leaning phenomena of the lower electrode 170 may occur.

FIGS. 16 to 20 are perspective and cross-sectional views illustrating a method of manufacturing a semiconductor device in accordance with some example embodiments. Specifically, FIGS. 16 to 19A and FIG. 20 are perspective views and FIGS. 19B and 19C are cross-sectional views illustrating the method of manufacturing the semiconductor device.

Figure 16:
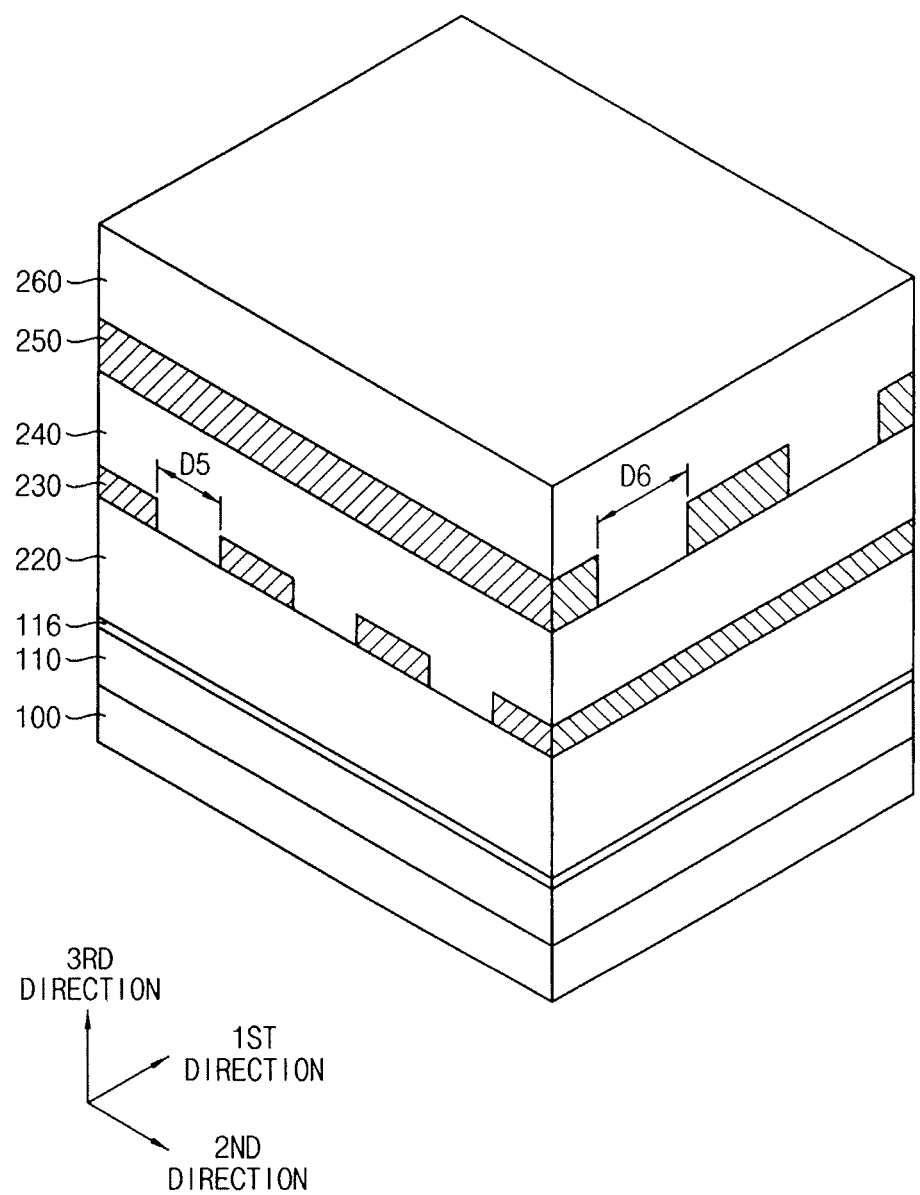
FIGS. 16, 17, 18, 19A, 19B, 19C and 20 illustrate perspective and cross-sectional views of stages of a method of manufacturing a semiconductor device in accordance with some example embodiments.

Referring to FIG. 16, processes substantially the same as or similar to those illustrated with reference to FIGS. 5 to 12 may be performed to form an insulating interlayer 110, an etch-stop layer 116, a first mold layer 220, a plurality of first supporting layer patterns 230, a second mold layer 240, a plurality of second supporting layer patterns 250 and a third mold layer 260 on a substrate 100.

In example embodiments, the first supporting layer pattern 230 may extend in a first direction and the second supporting layer pattern 250 may extend in a second direction substantially perpendicular to the first direction. The first supporting layer patterns 230 adjacent in the second direction may be spaced apart from each other by a fifth width D5. The second supporting layer patterns 250 adjacent in the first direction may be spaced apart from each other by a sixth width D6.

Figure 17:
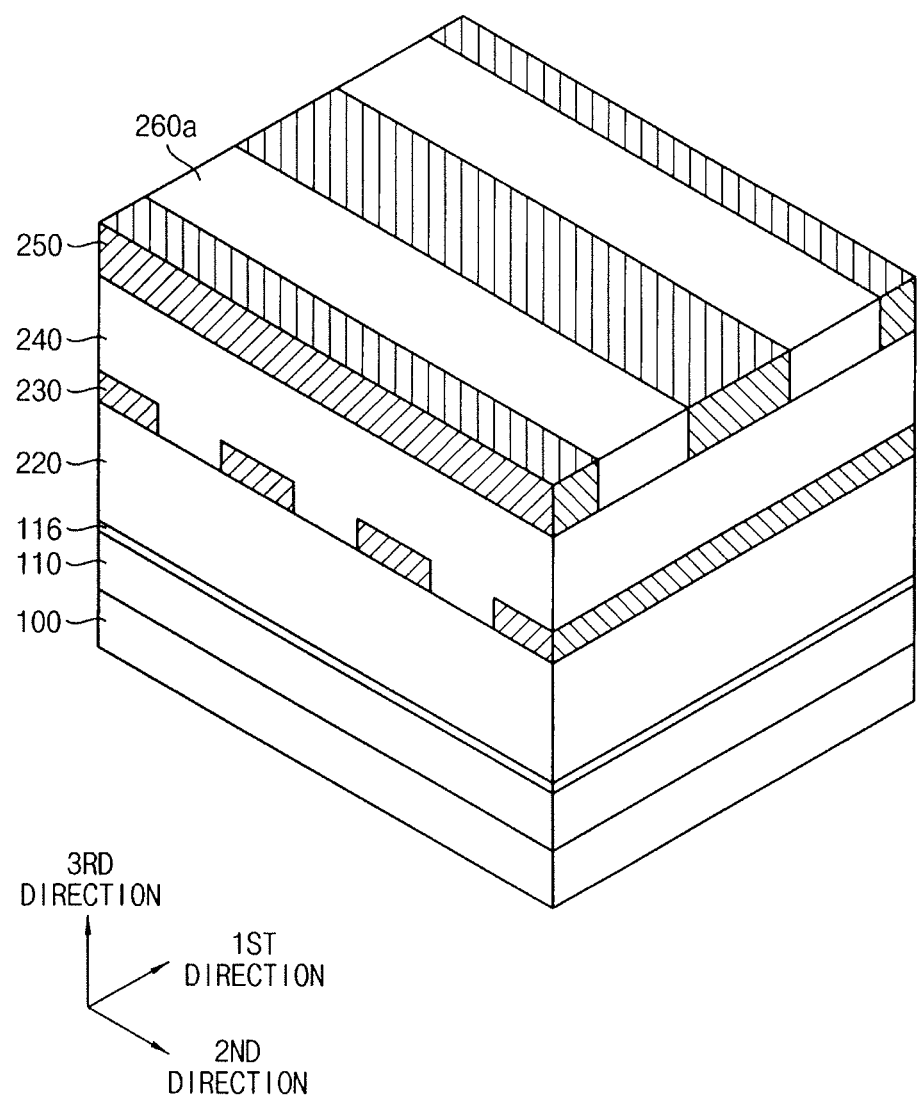

Referring to FIG. 17, an upper portion of the third mold layer 260 may be planarized until a top surface of the second supporting layer pattern 250 is exposed to form a third mold layer pattern 260a filling a space between the adjacent second supporting layer patterns 250.

Figure 18:
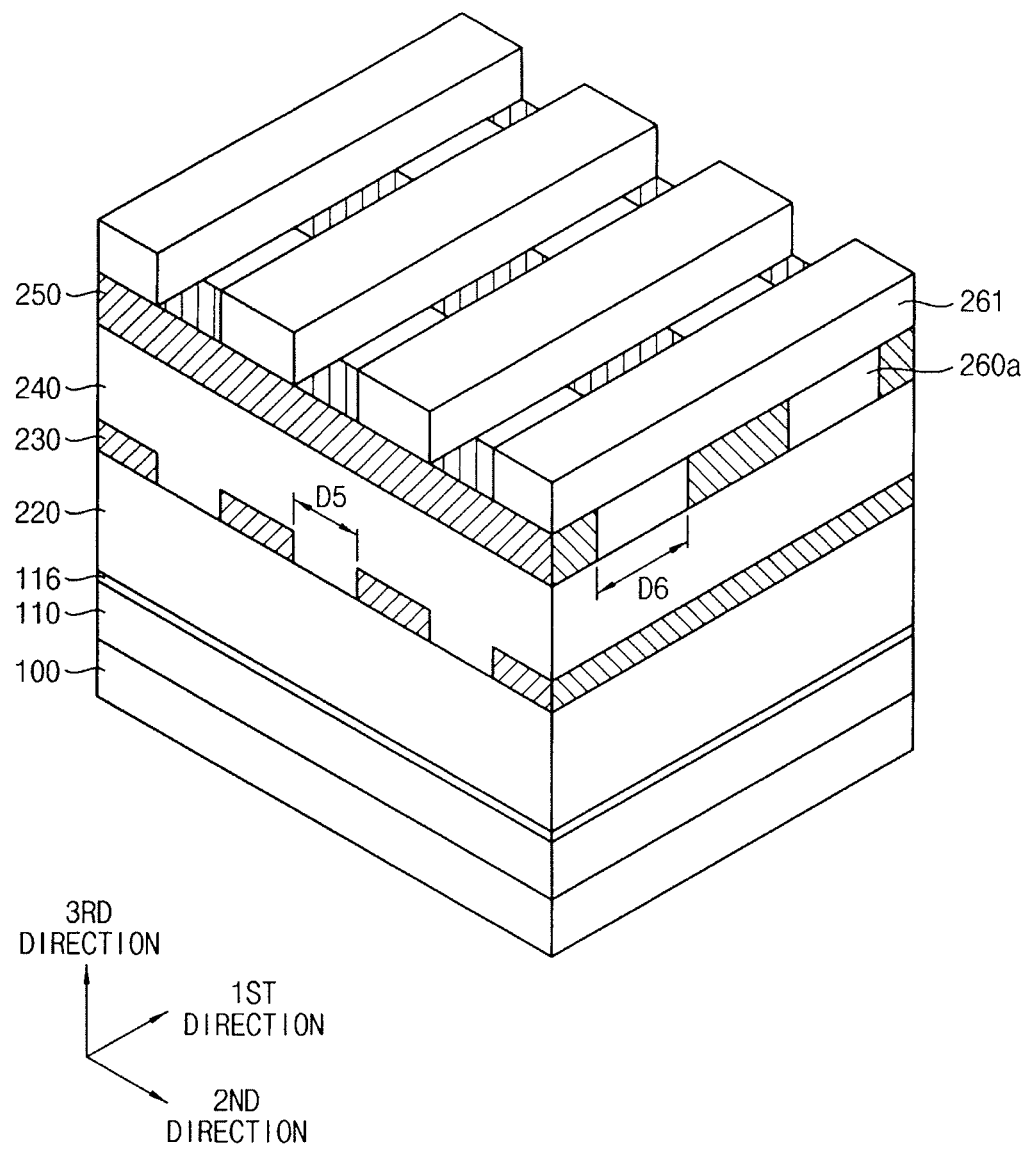

Referring to FIG. 18, a plurality of mask patterns 261 each of which may extend in the first direction may be formed on the second supporting layer patterns 250 and the third mold layer patterns 260a. The mask pattern 261 may substantially overlap the first supporting layer pattern 230. In example embodiments, the mask pattern 261 may be formed using a silicon based spin-on hard mask (Si—SOH), e.g., spin-on glass (SOG).

Figure 19A:
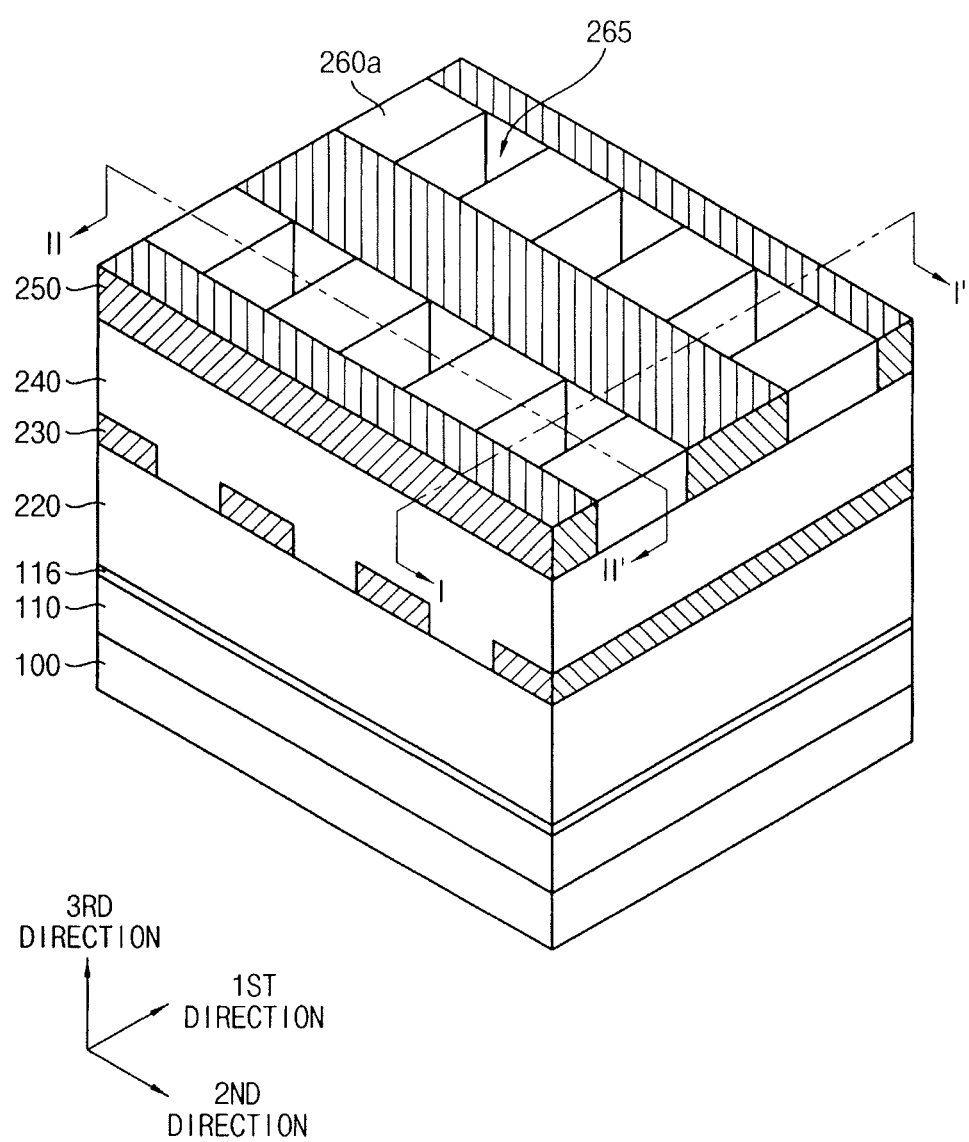

Referring to FIG. 19A, the third mold layer pattern 260a, the second mold layer 240 and the first mold layer 220 may be partially removed using the mask pattern 261 and the second supporting layer pattern 250 as an etching mask. The etch-stop layer 116 may be also partially removed. Accordingly, a plurality of openings 265 exposing plugs 112 (see FIGS. 19B and 19C) formed through the insulating interlayer 110 may be formed. The mask pattern 261 may be removed by, e.g., an ashing process and/or a strip process.

Figure 19B:
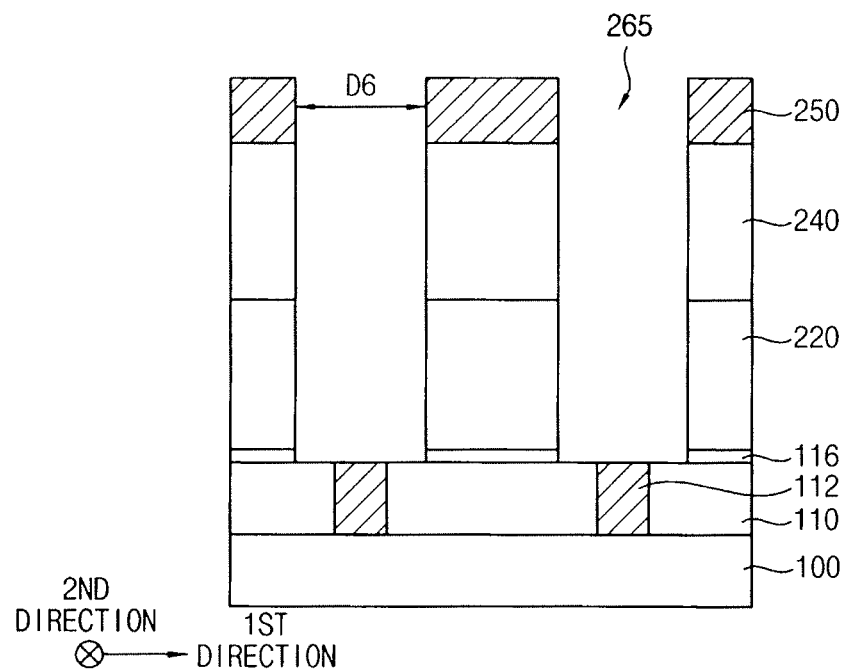

Referring to FIG. 19B, which is a cross-sectional view taken along a line I-I' of FIG. 19A, a width in the first direction of the opening 265 may be substantially the same as the sixth width D6.

Figure 19C:
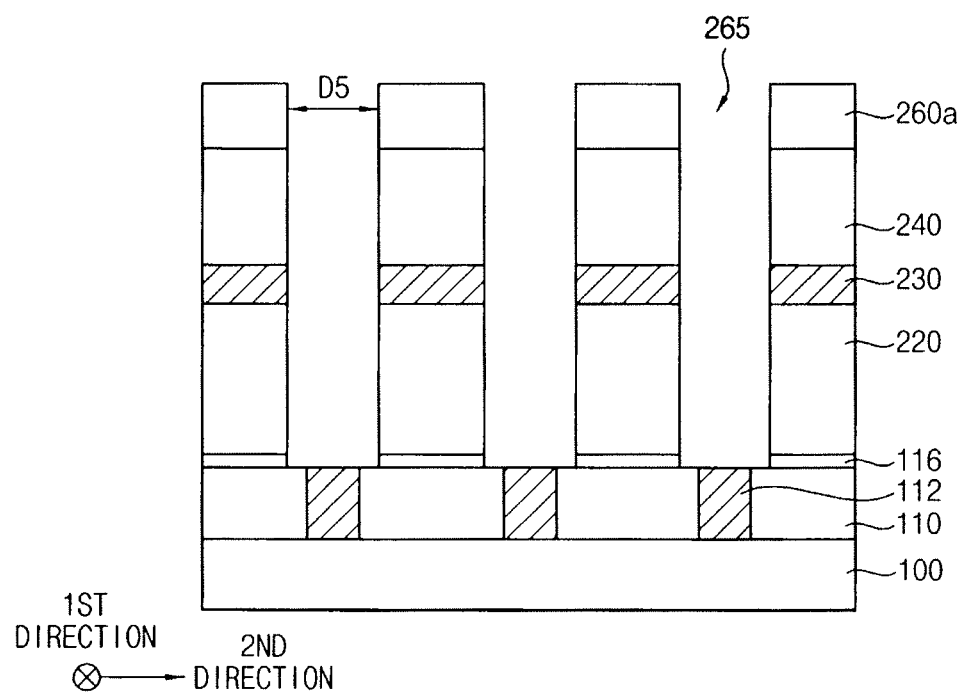

Referring to FIG. 19C, which is a cross-sectional view taken along a line II-II' of FIG. 19A, a width in the second direction of the opening 265 may be substantially the same as the fifth width D5.

Figure 20:
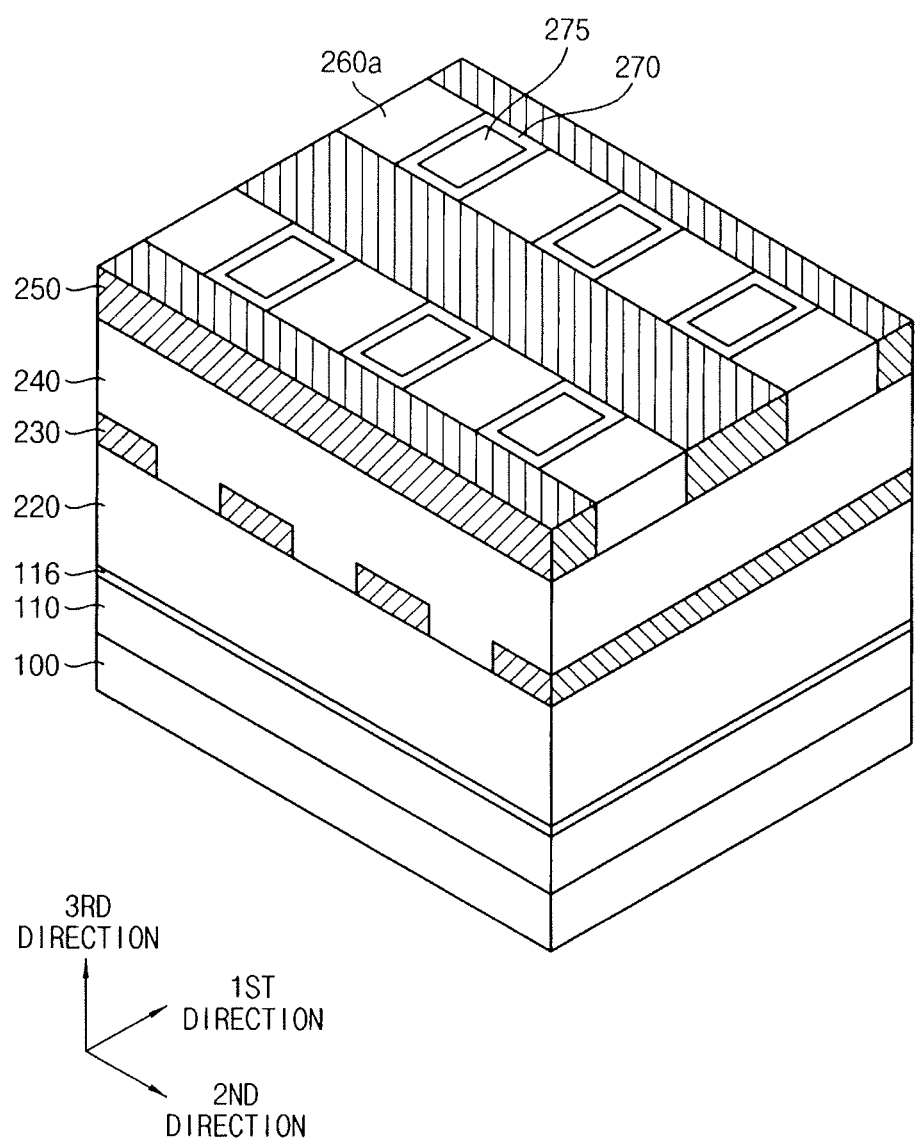

Referring to FIG. 20, a lower electrode 270 may be formed on an inner wall of the opening 265 and on the insulating interlayer 110 and the plug 112 exposed by the opening 265. A sacrificial layer pattern 275 filling a remaining portion of the opening 265 may be formed on the lower electrode 270.

In example embodiments, a lower electrode layer may be formed on the inner wall of the opening 265 and on the insulating interlayer 110 and the plug 112 exposed by the opening 265. A sacrificial layer may be formed on the lower electrode layer to sufficiently fill the opening 265.

Upper portions of the sacrificial layer and the lower electrode layer may be planarized to form the lower electrode 270 and the sacrificial layer pattern 275.

The sacrificial layer pattern 275, the first mold layer 220, the second mold layer 240 and the third mold layer pattern 260a may be removed by a wet etching process using. e.g., an HF solution or a BOE solution as an etching solution. Accordingly, a structure illustrated in FIG. 3 may be obtained.

Next, a process substantially the same as or similar to that illustrated with reference to FIGS. 15A and 15B may be performed. Accordingly, a dielectric layer may be formed on the lower electrode 270, the first supporting layer pattern 230, the second supporting layer pattern 250 and the etch-stop layer 116. An upper electrode may be formed on the dielectric layer to form capacitors.

By way of summation and review, as the integration degree of semiconductor devices increases and the design rule of semiconductor devices decreases, a capacitor in the semiconductor devices may have a high aspect ratio. Thus, a typical lower electrode of the capacitor may lean or collapse.

Additionally, when a critical dimension or a line width of the capacitor is very small, the adjacent lower electrodes may be short-circuited. Furthermore, a bowing phenomenon may occur when a contact hole for forming the lower electrode is formed, thereby to further reduce a distance between the adjacent lower electrodes. As a result, a bridge may be formed between the adjacent lower electrodes.

According to example embodiments, a lower portion and an upper portion of a lower electrode of a capacitor may be supported by first supporting layer patterns and second supporting layer patterns, respectively. The first and second supporting layer patterns may extend substantially perpendicularly to each other. Thus, the capacitor may have enhanced structural stability. Further, a width of the lower electrode may be controlled by the first and second supporting layer patterns so that a bridge or a short-circuit may not occur between the adjacent lower electrodes. Furthermore, the first and second supporting layer patterns may be formed prior to forming the lower electrode, and thus the first and second supporting layer patterns may be easily formed at desired positions of the lower electrode.

Moreover, example embodiments may provide methods of manufacturing semiconductor devices including such capacitors with good structural stability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a plurality of lower electrodes on a substrate, each of the lower electrodes extending in a height direction from the substrate and including sidewalls, the lower electrodes being spaced apart from each other in a first direction and in a second direction;
   a plurality of first supporting layer patterns extending in the first direction between ones of the lower electrodes that are adjacent to each other in the second direction, the first supporting layer patterns contacting the sidewalls of the ones of the lower electrodes that are adjacent to each other in the second direction; and
   a plurality of second supporting layer patterns extending in the second direction between ones of the lower electrodes that are adjacent to each other in the first direction, the second supporting layer pattern contacting the sidewalls of the ones of the lower electrodes that are adjacent to each other in the second direction, the plurality of second supporting layer patterns being spaced apart from the plurality of first supporting layer patterns in the height direction,
   each lower electrode including at least two different cross-sectional shapes, the cross-sectional shapes being taken in planes parallel to a top surface of the substrate or parallel to the height direction.

2. The semiconductor device as claimed in claim 1, further comprising:
   a dielectric layer on the lower electrodes; and
   an upper electrode on the dielectric layer.

3. The semiconductor device as claimed in claim 1, wherein each of the lower electrodes is supported by two of the first supporting layer patterns and two of the second supporting layer patterns.

4. The semiconductor device as claimed in claim 3, wherein each lower electrode includes:
   a first portion corresponding to a height from a top surface of the lower electrode to a top surface of the second supporting layer pattern;
   a second portion corresponding to a height from the top surface of the second supporting layer pattern to a top surface of the first supporting layer pattern; and
   a third portion corresponding to a height from the top surface of the first supporting layer pattern to a bottom surface of the lower electrode, and
   wherein the first, second and third portions have different cross-sectional shapes from one another, the cross-sectional shapes being taken in planes parallel to the top surface of the substrate or parallel to the height direction.

5. The semiconductor device as claimed in claim 4, wherein the first portion has a hollow cylindrical shape.

6. The semiconductor device as claimed in claim 4, wherein a width in the first direction of the second portion equals a distance between the two second supporting layer patterns supporting the lower electrode.

7. The semiconductor device as claimed in claim 6, wherein:
   the second portion of the lower electrode includes a first pair of second portion sidewalls opposing each other in the first direction and a second pair of second portion sidewalls opposing each other in the second direction, the first pair of second portion sidewalls being planar in a height direction, and the second pair of second portion sidewalls having a curved or rounded shape.

8. The semiconductor device as claimed in claim 4, wherein a width in the second direction of the third portion equals a distance between the two first supporting layer patterns supporting the lower electrode.

9. The semiconductor device as claimed in claim 8, wherein the third portion has a hollow rectangular parallelepiped shape.

10. The semiconductor device as claimed in claim 1, wherein the first and second supporting layer patterns include at least one of silicon nitride, silicon carbide, silicon oxynitride and silicon carbonitride.

* * * * *